United States Patent
Subramonium et al.

(10) Patent No.: US 7,381,644 B1
(45) Date of Patent: Jun. 3, 2008

(54) PULSED PECVD METHOD FOR MODULATING HYDROGEN CONTENT IN HARD MASK

(75) Inventors: Pramod Subramonium, Tigard, OR (US); Zhiyuan Fang, West Linn, OR (US); Jon Henri, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/318,269

(22) Filed: Dec. 23, 2005

(51) Int. Cl.
*H01L 21/44* (2006.01)
(52) U.S. Cl. .............. 438/671; 438/942; 257/E21.023
(58) Field of Classification Search ............ 438/758, 438/780, 781, 788, 789, 790, 671.942; 257/E21.023
See application file for complete search history.

(56) References Cited

U.S. PATENT DOCUMENTS

| | | |
|---|---|---|
| 4,357,451 A | 11/1982 | McDaniel |
| 4,882,008 A | 11/1989 | Garza et al. |
| 4,885,262 A | 12/1989 | Ting et al. |
| 4,968,384 A | 11/1990 | Asano |
| 5,231,057 A * | 7/1993 | Doki et al. ............... 438/637 |
| 5,281,546 A | 1/1994 | Possin et al. |
| 5,504,042 A | 4/1996 | Cho et al. |
| 5,648,175 A | 7/1997 | Russell et al. |
| 5,686,054 A | 11/1997 | Barthel et al. |
| 5,700,844 A | 12/1997 | Hedrick et al. |
| 5,789,027 A | 8/1998 | Watkins et al. |
| 5,849,640 A | 12/1998 | Hsia et al. |
| 5,851,715 A | 12/1998 | Barthel et al. |
| 5,858,457 A | 1/1999 | Brinker et al. |
| 5,920,790 A | 7/1999 | Wetzel et al. |
| 6,140,252 A | 10/2000 | Cho et al. |
| 6,149,828 A | 11/2000 | Vaartstra |
| 6,171,661 B1 | 1/2001 | Zheng et al. |
| 6,177,329 B1 | 1/2001 | Pang |
| 6,232,658 B1 | 5/2001 | Catabay et al. |

(Continued)

FOREIGN PATENT DOCUMENTS

WO    WO95/07543    3/1995

OTHER PUBLICATIONS

U.S. Office Action mailed May 31, 2006, from U.S. Appl. No. 10/941,502.
U.S. Office Action mailed May 30, 2006, from U.S. Appl. No. 10/785,235.

(Continued)

*Primary Examiner*—Asok K. Sarkar
(74) *Attorney, Agent, or Firm*—Weaver Austin Villeneuve & Sampson LLP

(57) ABSTRACT

A method for forming a PECVD deposited ashable hardmask (AHM) with less than 30% H content at a process temperature below 500° C., e.g., about 400° C. produces low H content hard masks having the property of high selectivity of the hard mask film to the underlying layers for successful integration of the film, and are suitable for use with 193 nm generation and below lithography schemes wherein high selectivity of the hard mask to the underlying layers is required. The low temperature, low H films are produced by use of a pulsed film hydrocarbon precursor plasma treatment that reduces the amount of hydrogen incorporated in the film and therefore drives down the etch rate of the hard mask thus increasing the selectivity. The lower temperature process also allows reduction of the overall thermal budget for a wafer.

31 Claims, 8 Drawing Sheets

U.S. PATENT DOCUMENTS

| | | | |
|---|---|---|---|
| 6,258,735 B1 | 7/2001 | Xia et al. | |
| 6,268,276 B1 | 7/2001 | Chan et al. | |
| 6,270,846 B1 | 8/2001 | Brinker et al. | |
| 6,271,273 B1 | 8/2001 | You et al. | |
| 6,306,564 B1 | 10/2001 | Mullee | |
| 6,312,793 B1 | 11/2001 | Grill et al. | |
| 6,329,017 B1 | 12/2001 | Liu et al. | |
| 6,329,062 B1 | 12/2001 | Gaynor | |
| 6,331,480 B1 * | 12/2001 | Tsai et al. | 438/624 |
| 6,340,628 B1 | 1/2002 | Van Cleemput et al. | |
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,420,441 B1 | 7/2002 | Allen et al. | |
| 6,444,715 B1 | 9/2002 | Mukherjee et al. | |
| 6,455,417 B1 | 9/2002 | Bao et al. | |
| 6,479,374 B1 | 11/2002 | Ioka et al. | |
| 6,500,770 B1 | 12/2002 | Cheng et al. | |
| 6,541,397 B1 | 4/2003 | Bencher | |
| 6,548,113 B1 | 4/2003 | Birnbaum et al. | |
| 6,573,030 B1 | 6/2003 | Fairbairn et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | |
| 6,610,362 B1 | 8/2003 | Towle | |
| 6,632,478 B2 | 10/2003 | Gaillard et al. | |
| 6,667,147 B2 | 12/2003 | Gallagher et al. | |
| 6,677,251 B1 | 1/2004 | Lu et al. | |
| 6,715,498 B1 | 4/2004 | Humayun et al. | |
| 6,756,085 B2 | 6/2004 | Waldfried et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 | 3/2005 | Chen et al. | |
| 6,903,004 B1 | 6/2005 | Spencer et al. | |
| 6,914,014 B2 | 7/2005 | Li et al. | |
| 6,943,121 B2 | 9/2005 | Leu et al. | |
| 6,967,072 B2 | 11/2005 | Latchford et al. | |
| 7,018,918 B2 | 3/2006 | Kloster et al. | |
| 7,087,271 B2 | 8/2006 | Rhee et al. | |
| 7,094,713 B1 | 8/2006 | Niu et al. | |
| 7,223,526 B2 | 5/2007 | Fairbairn et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0123240 A1 | 9/2002 | Gallagher et al. | |
| 2002/0141024 A1 | 10/2002 | Retschke et al. | |
| 2002/0192980 A1 | 12/2002 | Hogle et al. | |
| 2003/0064607 A1 | 4/2003 | Leu et al. | |
| 2003/0066544 A1 | 4/2003 | Jur et al. | |
| 2003/0119307 A1 | 6/2003 | Bekiaris et al. | |
| 2003/0157248 A1 | 8/2003 | Watkins et al. | |
| 2003/0198895 A1 | 10/2003 | Toma et al. | |
| 2004/0018750 A1 * | 1/2004 | Sophie et al. | 438/792 |
| 2004/0069410 A1 | 4/2004 | Moghadam et al. | |
| 2004/0096586 A1 | 5/2004 | Schulberg et al. | |
| 2004/0096593 A1 | 5/2004 | Lakas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0102032 A1 | 5/2004 | Kloster et al. | |
| 2004/0161532 A1 | 8/2004 | Kloster et al. | |
| 2004/0170760 A1 | 9/2004 | Meagley et al. | |
| 2004/0185679 A1 | 9/2004 | Ott et al. | |
| 2004/0224504 A1 * | 11/2004 | Gadgil | 438/680 |
| 2005/0064698 A1 | 3/2005 | Chang et al. | |
| 2006/0110931 A1 | 5/2006 | Fukazawa et al. | |
| 2006/0154086 A1 | 7/2006 | Fuller et al. | |
| 2006/0197881 A1 * | 9/2006 | Kang et al. | 349/38 |
| 2006/0205223 A1 | 9/2006 | Smayling | |
| 2007/0128538 A1 | 6/2007 | Fairbairn et al. | |

OTHER PUBLICATIONS

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al. "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Feb. 28, 2006, from U.S. Appl. No. 10/404,693.

U.S. Office Action mailed Mar. 29, 2006, from U.S. Appl. No. 10/800,377.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.

Humayun et al., "Method for Forming Porous Films By Porogen Removel Combined With In SITU Surface Modification", Novellus Corporation, U.S. Appl. No. 10/404,693, filed Mar. 31, 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods For Producing Low-K CDO Films With Low Residual Stress, filed Feb. 27, 2004.

Wu et al., U.S. Appl. No. 10/820,525, entitled: Methods For Producing Low-K CDO Films With Low Residual Stress, filed Apr. 7, 2004.

Wu et al., U.S. Appl. No. 10/800,409, entitled: Methods For Producing Low-K CDO Films, filed Mar. 11, 2004.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar 23, 2004, pp. 1-34.
Humayun et al., "Method For Forming Porous Films By Porogen Removal Combined With In Situ Modification", U.S. Appl. No. 10/404,693, filed Mar. 31, 2003, Office Action dated Mar. 15, 2005.
Tipton et al., "Method Of Porogen Removal From Porous Low-K Films Using UV Radiation", U.S. Appl. No. 10/672,311, filed Sep. 26, 2003, Office Action dated Sep. 7, 2004.
Tipton et al., "Method Of Porogen Removal From Porous Low-K Films Using UV Radiation", U.S. Appl. No. 10/672,311, filed Sep. 26, 2003, Office Action dated Dec. 28, 2004.
Tipton et al., "Method For Removal Of Porogens From Porous Low-K Films Using Supercritical Fluids", U.S. Appl. No. 10/672,305, Office Action dated Mar. 22, 2005.
Bandyopadhyay et al., "Method to Improve Mechanical Strength of Low-K Dielectric Film Using Modulated UV Exposure", U.S. Appl. No. 10/825,888, filed Apr. 16, 2004.
R.D. Miller et al., "Phase-Separated Inorganic-Organic Hybrids for Microelectronic Applications," MRS Bulletin, Oct. 1997, pp. 44-48.
Jin et al., "Nanoporous Silica as an Ultralow-k Dielectric," MRS Bulletin, Oct. 1997, pp. 39-42.
Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.
Asoh et al., "Conditions for Fabrication of Ideally Ordered Anodic Porous Alumina Using Pretextured Al," Journal of the Electrochemica Society, 148 (4) B152-B156 (2001) pp. B152-B156.
Holland et al., "Nonlithographic Technique for the Production of Large Area High Density Gridded Field Sources," J. Vac. Sci. Technol. B 17(2), Mar./Apr. 1999, pp. 580-582.
Masuda et al. "Highly Ordered Nanochannel-Array Architecture in Anodic Alumina," App. Phys. Lett. 71 (19), Nov. 1997, pp. 2770-2772.
Clube et al., White Paper from Holotronic Technologies SA; downloaded from www.hdotronic.com/whitepaper/fine-patt.pdf on Mar. 12, 2002.
Meli et al., "Self-Assembled Masks for the Transfer of Nanometer-Scale Patterns into Surfaces: Characterization by AFM and LFM", Nano Letters, vol. 2, No. 2, 2002, 131-135.
"Shipley Claims Porous Low K Dielectric Breakthrough," Press Release Mar. 17, 2003.
Jeffrey M. Calvert and Michael K. Gallagher, Semiconductor International, 26 (12), 56 (2003).
Van Bavel et al., Future Fab International, 16, (2004).
Caluwaerts et al, "Post Patterning Meso Porosity Creation: A Potential Solution For Pore Sealing," IITC 2003.
Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
Varadarajan, et al., "Strained Transistor Architecture and Method", Novellus Systems, Inc., U.S. Appl. No. 10/923,259, filed Aug. 20, 2004, pp. 1-24.
Niu et al., "Methods For Improving The Cracking Resistance Of Low-K Dielectric Materials", U.S. Appl. No. 10/860,340, filed Jun. 2, 2004.
Niu et al., "Methods For Improving The Cracking Resistance Of Low-K Dielectric Materials", U.S. Appl. No. 10/860,340, Office Action dated Mar. 2, 2005.
Niu et al., "Methods For Improving The Cracking Resistance Of Low-K Dielectric Materials", U.S. Appl. No. 10/860,340, Final Office Action dated Jun. 13, 2005.
Wang et al., "Plasma Detemplating And Silanol Capping Of Porous Dielectric Films", U.S. Appl. No. 10/785,235, filed Feb. 23, 2004.
Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.
Fox et al., "Methods For Producing Low-Stress Carbon-Doped Oxide Films With Improved Integration Properties", U.S. Appl. No. 10/987,208, filed Nov. 12, 2004.
Van Den Hoek et al., "VLSI Fabrication Processes For Introducing Pores Into Dielectric Materials", U.S. Appl. No. 11/050,621, filed Jan. 31, 2005.
Draeger et al., "Creation Of Porosity In Low-K Films By Photo-Disassociation Of Imbedded Nanoparticles," U.S. Appl. No. 11/146,456, filed Jun. 6, 2005.
Wu et al., "Methods For Producing Low Stress Porous Low-K Dielectric Materials Using Precursors With Organic Functional Groups", U.S. Appl. No. 10/927,777, filed Aug. 27, 2004.
Wu et al., "Methods For Improving Integration Performance Of Low Stress CDO Films", U.S. Appl. No. 10/941,502, filed Sep. 14, 2004.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Office Action mailed Jul. 13, 2005, from U.S. Appl. No. 10/672,311.
U.S. Office Action mailed Jul. 27, 2005, from U.S. Appl. No. 10/785,235.
U.S. Office Action mailed Aug. 24, 2005, from U.S. Appl. No. 10/404,693.
U.S. Office Action mailed Sep. 1, 2005, from U.S. Appl. No. 10/672,305.
Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.
U.S. Office Action mailed Dec. 20, 2005, from U.S. Appl. No. 10/672,311.
U.S. Office Action mailed Feb. 7, 2006, from U.S. Appl. No. 10/672,305.
U.S. Office Action mailed Dec. 20, 2005, from U.S. Appl. No. 10/849,568.
U.S. Office Action mailed Jan. 9, 2006, from U.S. Appl. No. 10/785,235.
U.S. Office Action mailed Dec. 27, 2005, from U.S. Appl. No. 10/789,103.
U.S. Office Action mailed Dec. 23, 2005, from U.S. Appl. No. 10/800,409.
Ikeda et al., "Top-PECVD": A New Conformal Plasma Enhanced CVD Technology using TEOS, Ozone and Pulse-modulated RF Plasma, 1992 IEEE, pp. 11.2.1-11.2.4.
U.S. Office Action mailed Sep. 8, 2006, from U.S. Appl. No. 10/404,693.
U.S. Office Action mailed Sep. 7, 2006, from U.S. Appl. No. 10/820,525.
U.S. Office Action mailed Jul. 12, 2006, from U.S. Appl. No. 10/672,305.
Wu et al., "Methods for Fabricating High Hardness/modules Low Dielectric Constant Materials," Novellus Systems, Inc., U.S. Appl. No. 11/369,658, filed Mar. 6, 2006, pp. 1-33.
Dhas et al., "Method of Reducing Defects in PECVD TEOS Films," Novellus Systems, Inc., U.S. Appl. No. 11/396,303, filed Mar. 30, 2006, pp. 1-21.
U.S. Office Action mailed Oct. 18, 2006, from U.S. Appl. No. 10/849,568.
Subramonium et al., "Methods of Depositing Highly Selective Transparent Ashable Hardmask Films," Novellus Systems, Inc., U.S. Appl. No. 11/449,983, filed Jun. 8, 2006, pp. 1-21.
U.S. Appl. No. 11/612,382, *Methods of improving ashable hardmask adhesion to metal layers*, Fang et al., filed Dec. 18, 2006.
U.S. Appl. No. 11/612,382, Office Action mailed Jun. 1, 2007.

* cited by examiner

| Number of Pulses | Pulse Frequency (Hz) | Duty cycle (%) | H content (%) | Film Thickness (A) |
| --- | --- | --- | --- | --- |
| 54 | 0.15 | 25 | 15 | 2000 |
| 40 | 0.15 | 25 | 15 | 1500 |
| 27 | 0.15 | 25 | 15 | 1000 |
| 18 | 0.05 | 25 | 22 | 2000 |
| 30 | 0.09 | 25 | 18 | 2000 |

FIG. 8

PULSED PECVD METHOD FOR MODULATING HYDROGEN CONTENT IN HARD MASK

FIELD OF THE INVENTION

This invention relates to a novel method of producing ashable hard masks in semiconductor processing.

BACKGROUND OF THE INVENTION

Ashable hard masks (AHM) are used as etch stop layers in semiconductor processing. Etch selectivity of AHM is influenced primarily by the incorporated concentration of hydrogen. Reducing the amount of hydrogen incorporated in the film drives down the etch rate of the hard mask, thus increasing the selectivity.

To date, known methods of producing AHM with low hydrogen (H) content (e.g., below 20%) rely on a relatively high temperature (greater than 500°) PECVD deposition process. Many PECVD reactors are not designed to withstand such high processing temperatures, however. At backend process temperatures of about 400° C. and below, films typically have a high hydrogen content (about 40%) and corresponding relatively low etch selectivity. Accordingly, it would be desirable to be able to produce a hard mask film with a low hydrogen content (e.g., less than 30%, or 20%) and high etch selectivity at a relatively low deposition temperature (below 500° C., e.g., no more than 400° C.).

SUMMARY OF THE INVENTION

The present invention addresses this need by providing a method for forming a PECVD deposited ashable hardmask (AHM) with less than 30 atomic % H content (e.g., less than 20% H content) at a process temperature below 500° C., e.g., about 400° C. Low H content hard masks produced according to the invention have the property of high selectivity of the hard mask film to the underlying layers for successful integration of the film, and are suitable for use with 193 nm generation and below lithography schemes wherein high selectivity of the hard mask to the underlying layers is required. The low temperature, low H films are produced by use of a pulsed film hydrocarbon precursor plasma treatment that reduces the amount of hydrogen incorporated in the film and therefore drives down the etch rate of the hard mask thus increasing the selectivity. The lower temperature process also allows reduction of the overall thermal budget for a wafer.

The invention provides low temperature, low H hard mask films produced by use of a pulsed film hydrocarbon precursor plasma treatment. The pulsed delivery of the precursor reduces the amount of hydrogen incorporated in the resulting film and therefore drives down the etch rate of the hard mask thus increasing the selectivity. Other deposition process parameters, including plasma power, carrier gas flow and chamber pressure, may also be pulsed or modulated. The pulse characteristics can be varied by varying the pulse repetition frequency (frequency of turning the pulse ON and OFF) and duty cycle (fraction of time during which the precursor pulse is ON). For example, for a pulse with a frequency of 0.1 Hz and duty cycle of 40%, one pulse period is 10 seconds with precursor pulse being ON for only 4 seconds. This additional pulsing can enhance the effect in certain applications. Generally, the hydrogen content of the resulting hard mask may be modulated by pulsing of the hard mask precursor delivery alone or in combination with one or more other deposition process parameters.

Deposition of an ashable hard mask by a plasma enhanced chemical vapor deposition (PECVD) process wherein the process temperature is below 500° C. and the resulting hard mask has a hydrogen content of less than 30% can be accomplished by a deposition process including a pulsed delivery flow of a hard mask precursor to the deposition chamber. The ashable hard mask is deposited on the substrate by a plasma enhanced chemical vapor deposition (PECVD) process wherein the process temperature of below 500° C. (e.g., no more than 400° C., or 300–400° C. or about 400° C.) wherein the precursor delivery flow is pulsed (i.e., has a duty cycle of less than 100%; e.g., 10 to 50%, 20 to 40%, such as 25 or 40%). The pulsed precursor delivery flow can have a frequency of between about 0.05 and 1 Hz, or about 0.09 and 0.2 Hz, or about 0.1 and 0.15 Hz, for example about 0.1 Hz.

These and other aspects and advantages of the invention are described further below and with reference to the drawings.

BRIEF DESCRIPTION OF THE DRAWINGS

FIG. 8 is a table showing data illustrating the effect of varying the number of precursor pulses in a hard mask film deposition process in accordance with one aspect of the present invention.

DETAILED DESCRIPTION OF THE INVENTION

Figure 1:
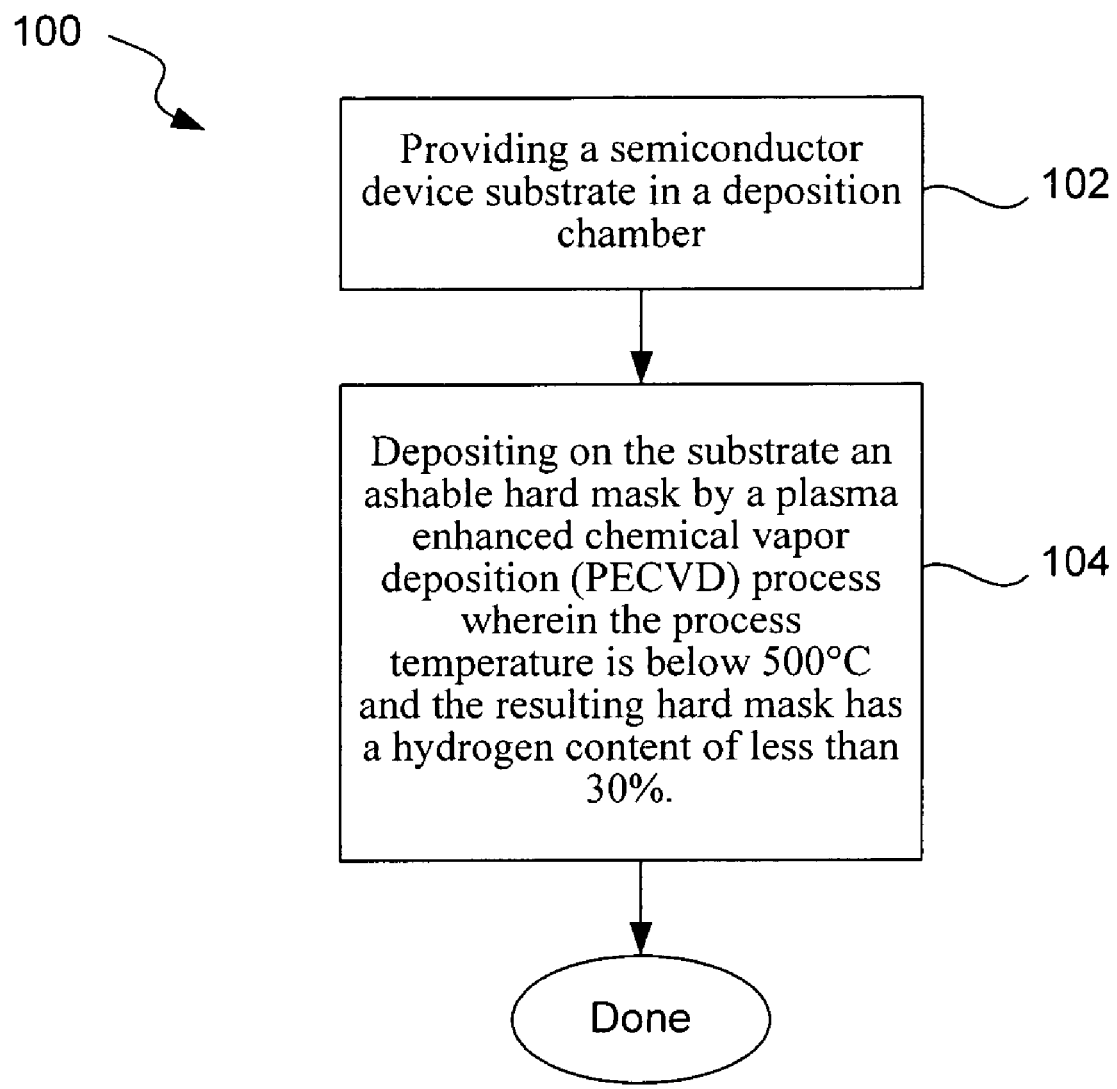
FIG. 1 depicts important stages in a general process flow for a method of forming an ashable hard mask in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

INTRODUCTION

Hard masks are used as etch stop layers in semiconductor processing. Ashable hard masks (AHM) have a chemical composition that allows them to be removed by a technique referred to as ashing once they have served their purpose. An ashable hard mask is generally composed of carbon & hydrogen with trace amount of on eor more dopants (e.g., Nitrogen, Fluorine, Boron, Silicon). The bonding structure in these hard masks can vary from SP2 (graphite-like) to SP3 (diamond-like) or a combination of both, depending on the deposition conditions. In a typical application, after etching, the hard mask has served its purpose and must be removed from the underlying dielectric oxide (e.g., $SiO_2$). This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Etch selectivity of AHM is influenced primarily by the incorporated concentration of hydrogen. Reducing the amount of hydrogen incorporated in the film drives down the etch rate of the hard mask, thus increasing the selectivity relative to an underlying oxide dielectric. The lower temperature process also allows reduction of the overall thermal budget for a wafer.

The present invention produces AHM with low hydrogen content (less than 30%, e.g., less than 25% or less than 20% or about 15%) for process temperatures below 500° C. (e.g., below 400° C., or 300–400° C.). Such lower process temperatures are compatible with existing semiconductor processing equipment, in particular PECVD reactors, such as Sequel™ or Vector™ reactor chambers available from Novellus Systems, Inc., San Jose, Calif. Thus, an ashable hard mask with the improved performance characteristic of increased selectivity, may be made without any hardware change.

Pulsed PECVD Deposition Process

The invention provides low temperature, low H hard mask films produced by use of a pulsed film hydrocarbon precursor plasma treatment. The pulsed delivery of the precursor reduces the amount of hydrogen incorporated in the resulting film and therefore drives down the etch rate of the hard mask thus increasing the selectivity. Other deposition process parameters, including plasma power, carrier gas flow and chamber pressure, may also be pulsed or modulated. The pulse characteristics can be varied by varying the pulse repetition frequency (frequency of turning the pulse ON and OFF) and duty cycle (fraction of time during which the precursor pulse is ON). For example, for a pulse with a frequency of 0.1 Hz and duty cycle of 40%, one pulse period is 10 seconds with precursor pulse being ON for only 4 seconds. This additional pulsing can enhance the effect in certain applications. Generally, the hydrogen content of the resulting hard mask may be modulated by pulsing of the hard mask precursor delivery alone or in combination with one or more other deposition process parameters.

FIG. 1 depicts important stages in a general process flow for a method of forming an ashable hard mask in accordance with the present invention. The method (100) involves providing a semiconductor device substrate in a deposition chamber (102) and depositing on the substrate an ashable hard mask by a plasma enhanced chemical vapor deposition (PECVD) process wherein the process (substrate) temperature is below 500° C. and the resulting hard mask has a hydrogen content of less than 30% (104).

Figure 2:
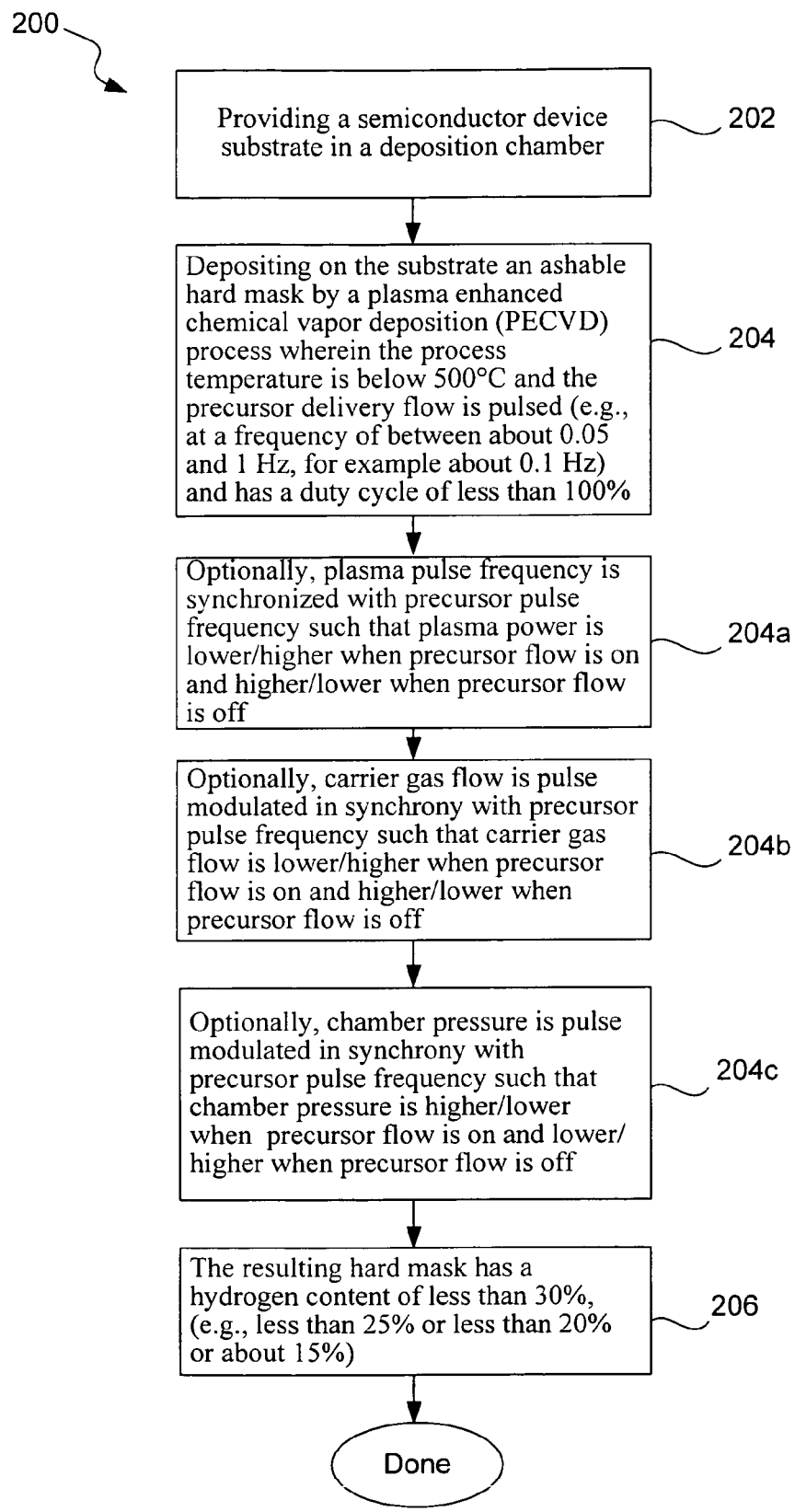
FIG. 2 depicts important stages in a general process flow for a method of forming an ashable hard mask in accordance with a specific embodiment of the present invention.

Deposition of an ashable hard mask by a plasma enhanced chemical vapor deposition (PECVD) process wherein the process temperature is below 500° C. and the resulting hard mask has a hydrogen content of less than 30% can be accomplished by a deposition process including a pulsed delivery flow of a hard mask precursor to the deposition chamber. Referring to FIG. 2, a process flow for a method of forming an ashable hard mask according to a specific embodiment of this aspect of the invention. The method (200) again involves providing a semiconductor device substrate in a deposition chamber (202). The ashable hard mask is deposited on the substrate by a plasma enhanced chemical vapor deposition (PECVD) process wherein the process temperature of below 500° C. (e.g., no more than 400° C., or 300–400° C. or about 400° C.) wherein the precursor delivery flow is pulsed, i.e., has a duty cycle of less than 100% (e.g., 10 to 50%, 20 to 40%, such as 25 or 40%) (204). The pulsed precursor delivery flow can have a frequency of between about 0.05 and 1 Hz, or about 0.09 and 0.2 Hz, or about 0.1 and 0.15 Hz, for example about 0.1 Hz.

The precursor is a generally a hydrocarbon, for example, one defined by the formula $C_XH_Y$, wherein X=2 to 10 and Y=2–24. Specific examples include methane, acetylene, ethylene, propylene, butane, cyclohexane, benzene and toluene and ($CH_4$, $C_2H_2$, $C_2H_4$, $C_3H_6$, $C_4H_{10}$, $C_6H_6$, $C_6H_{12}$ and $C_7H_8$, respectively). Ethylene is a preferred precursor in many applications.

Figure 3:
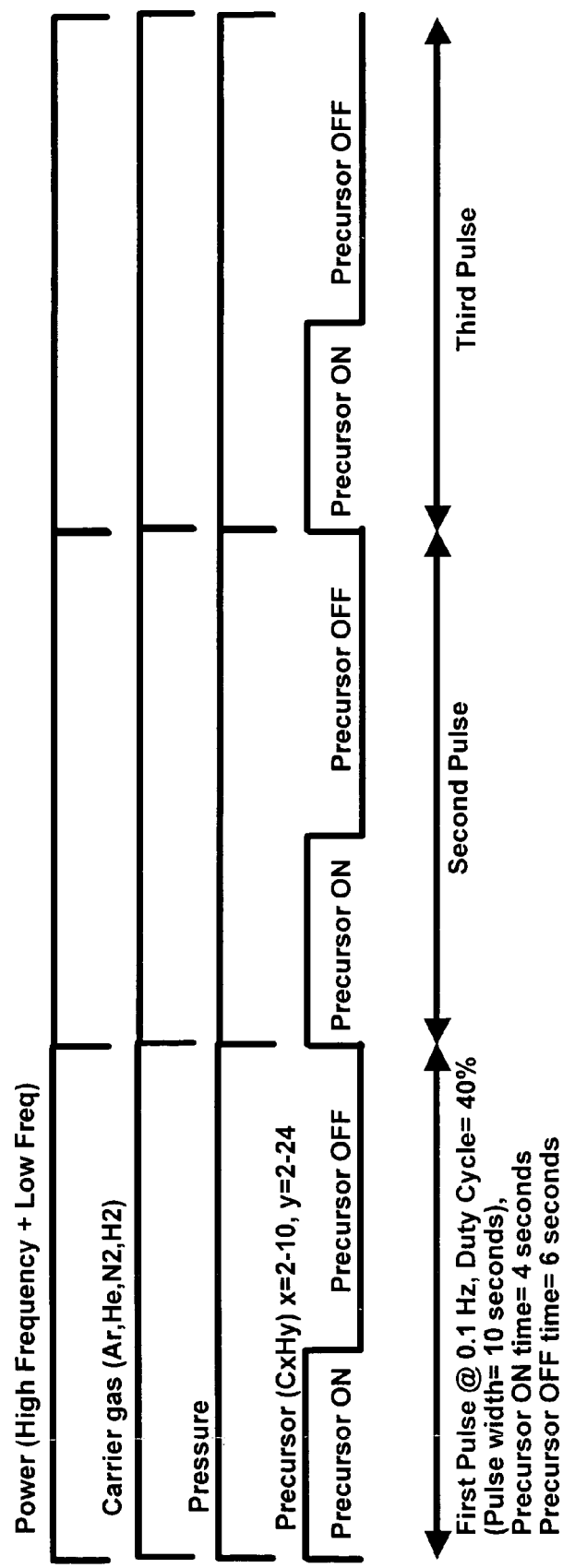
FIG. 3 depicts a timing sequence diagram for one specific embodiment of the invention.

FIG. 3 depicts a timing sequence diagram for one specific embodiment of the invention in which an ashable hard mask is formed by a plasma enhanced chemical vapor deposition (PECVD) process having the following parameters: a process temperature of about 400° C., a 0.1 Hz pulsed delivery flow of a hard mask precursor to the deposition chamber with a duty cycle of 40%. The remaining process parameters are held static. This results in a pulse width of 10 seconds with a precursor flow on time of 4 seconds/off time of 6 seconds. Three pulse are shown in the figure. In other embodiments, the pulse frequency can be varied, for example from 0.05 to 1 Hz. During each pulse, between about 10 to 100 Å of film is grown; therefore, to grow a 2000 Å film, as would be common for a typical hard mask, 20–200 precursor pulses would be required.

Referring again to FIG. 2, in addition, other deposition process parameters, including plasma power, carrier gas flow and chamber pressure, may also optionally be pulsed or modulated. For example, the plasma pulse frequency can be synchronized with the precursor pulse frequency such that the plasma power is lower when the precursor flow is on and higher when the precursor flow is off; or vice versa such that the plasma power is higher when the precursor flow is on and lower when the precursor flow is off (204a). In addition, or in the alternative, the carrier gas flow is pulse modulated in synchrony with the precursor pulse frequency such that the carrier gas flow is lower when the precursor flow is on and higher when the precursor flow is off; or vice versa such that the carrier gas flow is higher when the precursor flow is on and lower when the precursor flow is off (204b). And in addition, or in the alternative, the chamber pressure is pulse modulated in synchrony with the precursor pulse frequency such that the chamber pressure is higher when the precursor flow is on and lower when the precursor flow is off; or vice versa such that the chamber pressure is lower when the precursor flow is on and higher when the precursor flow is off (204c).

Figure 4:
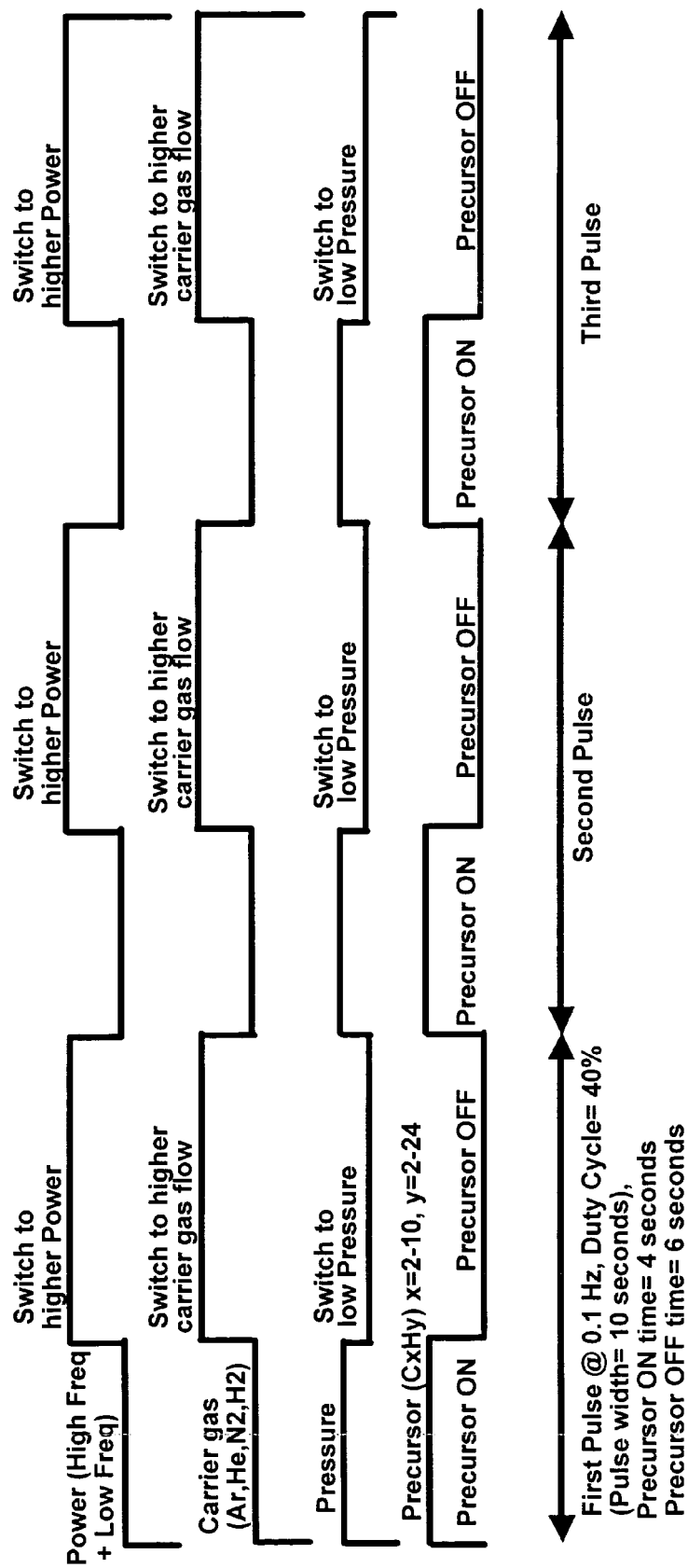
FIG. 4 depicts a timing sequence diagram for another specific embodiment of the invention.

FIG. 4 depicts a timing sequence diagram for another specific embodiment of the invention in which an ashable hard mask is formed by a plasma enhanced chemical vapor deposition (PECVD) process having the same process parameters as described above with reference to FIG. 3, and, in addition, an instance of each of the optional modulated process parameters described with reference to FIG. 2, 204a, 204b and 204c. That is, the plasma pulse frequency is synchronized with the precursor pulse frequency such that the power is lower when the precursor flow is on and higher when the precursor flow is off; the carrier gas flow is pulse modulated in synchrony with the precursor pulse frequency such that the carrier gas flow is lower when the precursor flow is on and higher when the precursor flow is off; and the chamber pressure is pulse modulated in synchrony with the precursor pulse frequency such that the chamber pressure is higher when the precursor flow is on and lower when the precursor flow is off.

Once more referring to FIG. 2, the resulting hard mask has a hydrogen content of less than 30%, e.g., less than 25% or less than 20% or about 15%) (206).

An aspect of the invention may also be expressed as a method of forming an ashable hard mask, the method involving providing a semiconductor device substrate in a deposition chamber, and depositing on the substrate an ashable hard mask by a plasma enhanced chemical vapor deposition (PECVD) process having a process temperature of less than 500° C. and a pulsed delivery flow of a hard mask precursor to the deposition chamber (for example, at a frequency of between about 0.05 and 1 Hz) with a duty cycle of less than 100%. The resulting hard mask has a hydrogen content of less than 30%. In a specific embodiment, the process has a process temperature of no more than about 400° C., a pulsed delivery flow of a hard mask precursor to the deposition chamber having a frequency of between about 0.05 and 1 Hz with a duty cycle of less than 50%, and the resulting hard mask has a hydrogen content of less than 20%.

In yet another aspect, the invention may also be expressed as a method of modulating hydrogen content in a deposited ashable hard mask. The method involves determining a base ashable hard mask hydrogen concentration resulting from deposition using plasma enhanced chemical vapor deposition (PECVD) process parameters comprising a static hard mask precursor delivery flow to the deposition chamber; providing a semiconductor device substrate in a deposition chamber; and depositing on the substrate an ashable hard mask by the plasma enhanced chemical vapor deposition (PECVD) process altered such that the precursor delivery flow is pulsed, for example, at a frequency of between about 0.05 and 1 Hz. The hydrogen content in the resulting deposited ashable hard mask is less than the base ashable hard mask hydrogen concentration. In a specific embodiment, the process has a process temperature of less than 500° C., e.g., no more than about 400° C., a pulsed delivery flow of a hard mask precursor to the deposition chamber having a frequency of between about 0.05 and 1 Hz with a duty cycle of less than 100%, e.g., less than 50%, and the resulting hard mask has a hydrogen content of less than 30%, e.g., less than 20%.

The other parameters for modulating process conditions described above also apply to these alternatively expressed aspects of the invention. In all aspects, the hydrogen content can be modulated by varying the number of pulses and the pulse frequency and duty cycle.

While the invention is not limited by any particular theory, it is believed that the H content in the hard mask film is reduced by breaking —CHx bonds in the film and subsequent formation of —C═C— by plasma treatment of few monolayers of as-deposited film, as is achieved by hard mask precursor pulsing in accordance with the present invention.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, for a 2000 Å hard mask film deposition, 500 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 5:
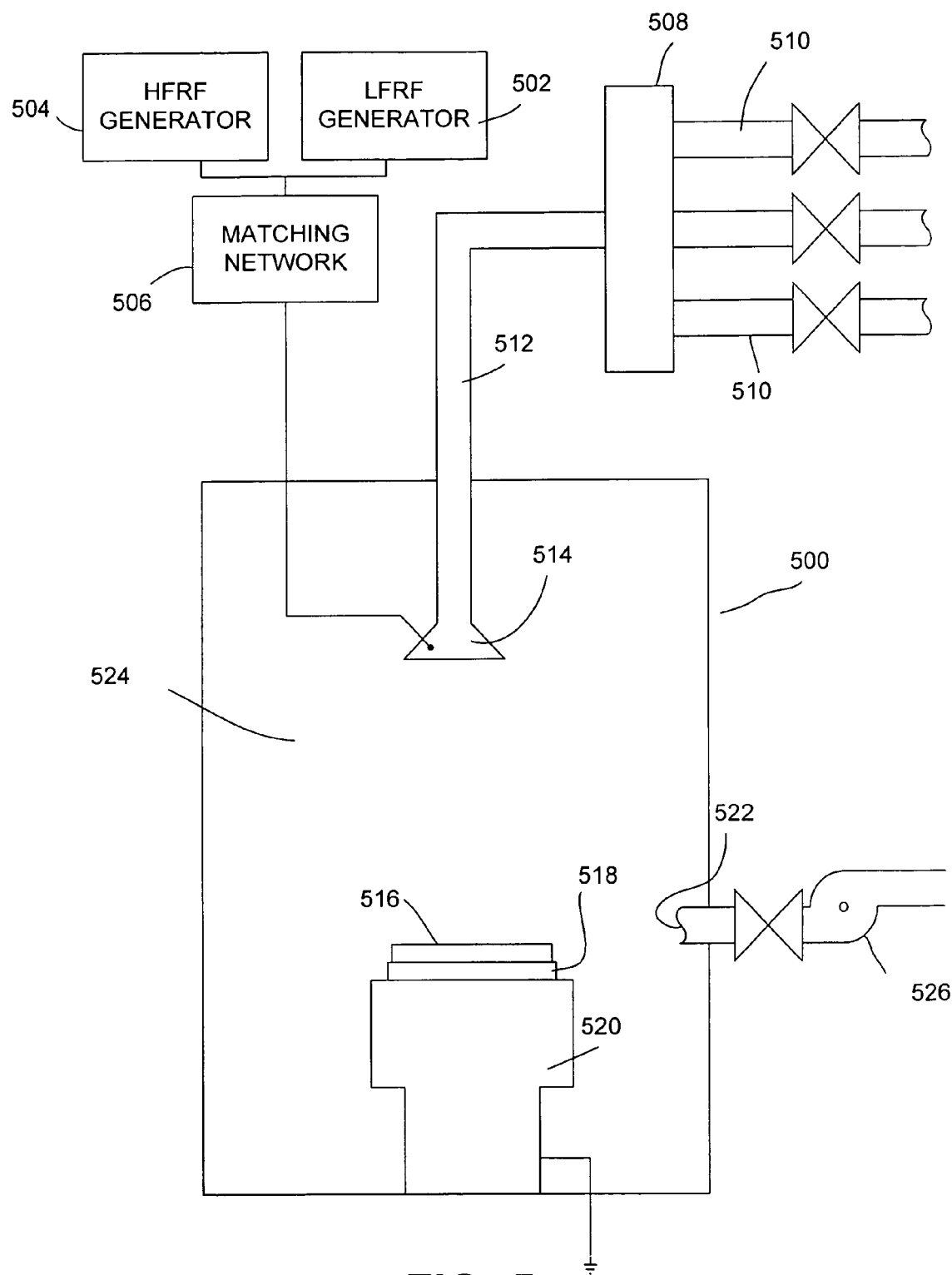
FIG. 5 is a simple block diagram depicting a PECVD reactor arranged for implementing the present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502, connected to a matching network 506, and a low-frequency RF generator 504 are connected to showerhead 514. The power and frequency supplied by matching network 506 is sufficient to generate a plasma from the process gas, for example 400–700 W total energy. In the implementation of the present invention only the HFRF generator is used. In a typical process, the high frequency RF component is generally between 2–60 MHz; in a preferred embodiment, the HF component is 13.56 MHz.

Within the reactor, a wafer pedestal 518 supports a substrate 516. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

Examples

The following examples are provided to further illustrate aspects and advantages of the present invention. These examples are provided to exemplify and more clearly illustrate aspects of the present invention and are in no way intended to be limiting.

Figure 6:
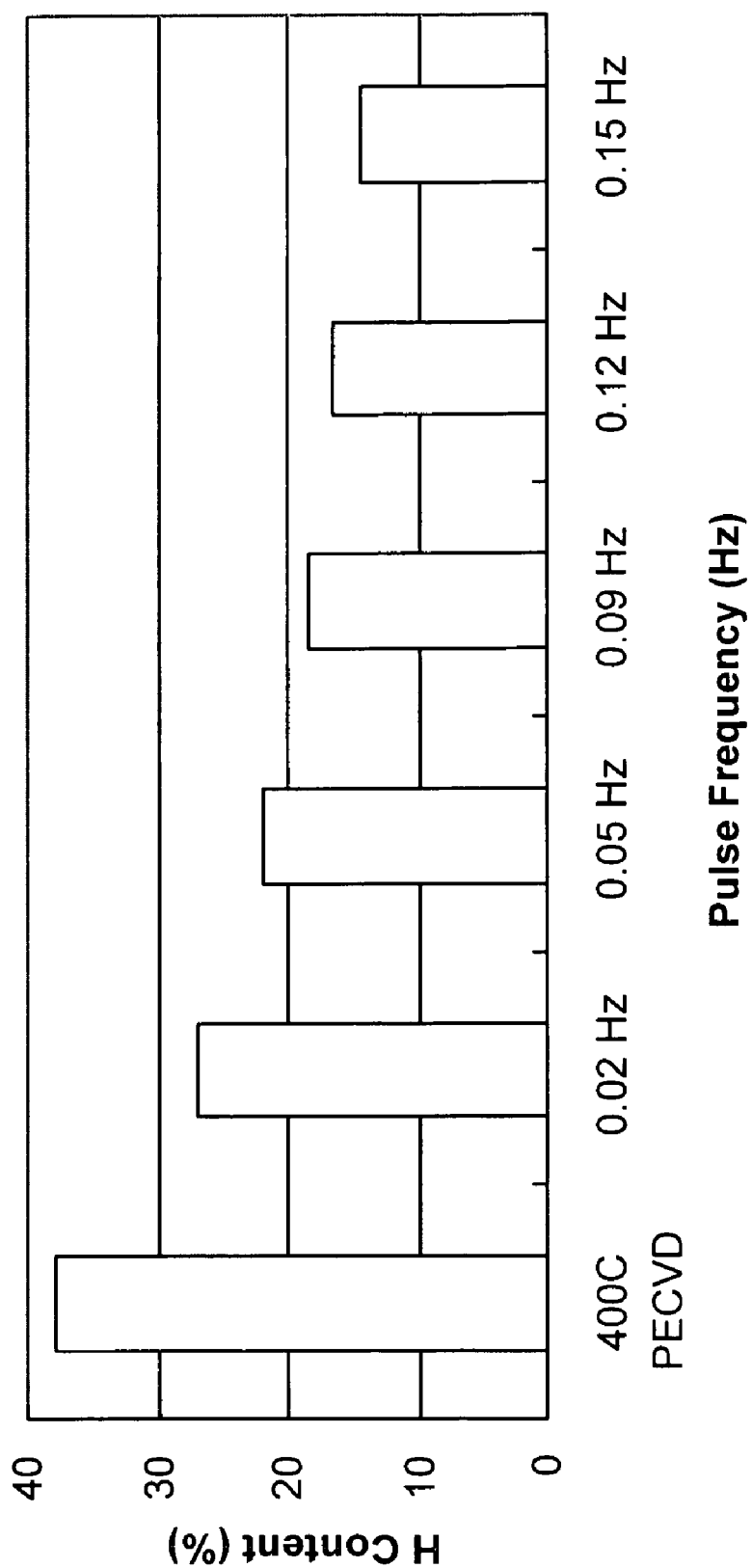
FIG. 6 depicts a histogram plot showing the effect of varying the precursor pulse frequency in accordance with one aspect of the present invention.

Referring to FIG. 6, the effect of varying the precursor pulse frequency is illustrated. Hydrogen content in the resulting hard mask film can be varied from about 40% for a 400° C. PECVD process having a static precursor flow (duty cycle of 100%) to about 15% H for a hard mask film deposited using a 400° C. PECVD process having a pulsed precursor flow in accordance with the present invention. Increasing the pulse frequency from 0.02 to 0.15 Hz decreased hydrogen content from about 28% to about 15%. Duty cycle was maintained at 25% for this study, and plasma power, carrier gas flow and chamber pressure were kept static. The following table lists the parameters for the process used in the experiment for this example (with pulse frequency of 0.15 Hz and duty cycle of 25%).

| Precursor ON Phase | | Parameter Range |
|---|---|---|
| N2 (sccm) | 1000 | 0 to 10000 |
| C2H2 (sccm) | 900 | 0 to 10000 |
| He (sccm) | 9000 | 1000 to 20000 |
| HF Power (W) | 600 | 0 to 5000 |
| LF Power (W) | 600 | 0 to 5000 |
| Pressure (Torr) | 5 | 1 to 20 |
| Precursor ON time (sec) | 1.7 | 0 to 60 |
| Precursor OFF Phase | | Parameter Range |
| N2 | 1000 | 0 to 10000 |
| C2H2 | 0 | 0 |
| He | 9000 | 1000 to 20000 |
| HF Power | 600 | 0 to 5000 |
| LF Power | 1200 | 0 to 5000 |
| Pressure | 4 | 1 to 20 |
| Precursor OFF time (sec) | 5 | 0 to 60 |

Figure 7:
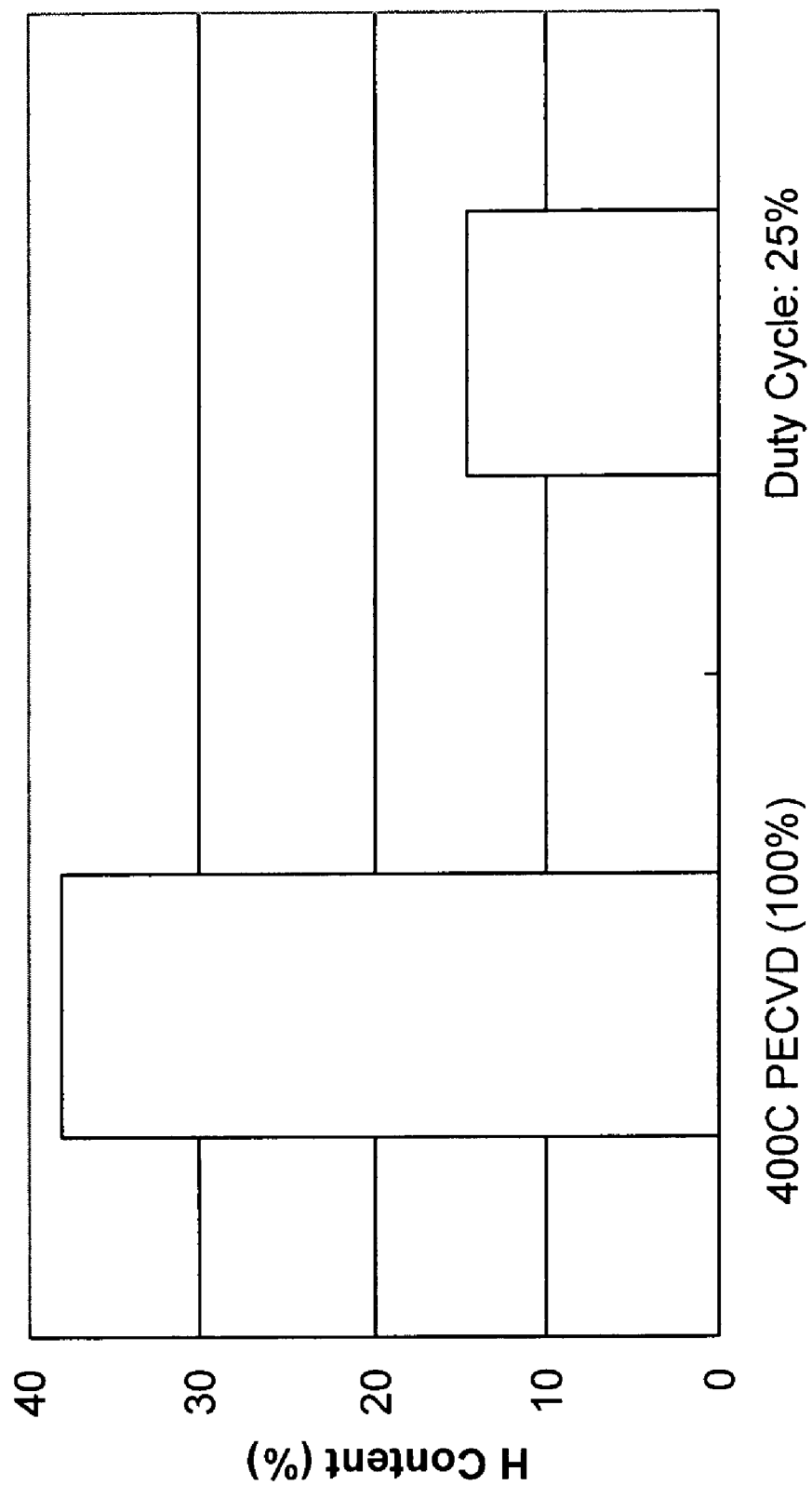
FIG. 7 depicts a histogram plot showing the effect of varying the precursor pulse duty cycle in accordance with one aspect of the present invention.

Referring to FIG. 7, the effect of varying the precursor pulse duty cycle is illustrated. Hydrogen content in the resulting hard mask film can be varied from about 40% for a 400° C. PECVD process having a static precursor flow and 100 duty cycle to about 15% for a hard mask film deposited using a 400° C. PECVD process having a pulsed precursor flow with a frequency of 0.15 Hz and a 25% duty cycle in accordance with the present invention. Plasma power, carrier gas flow and chamber pressure were kept static for this study.

Referring to FIG. 8, the effect of varying the number of precursor pulses is illustrated. For a particular pulse frequency and duty cycle, H content remains the same. Therefore, as shown in the table, films with different thicknesses but with similar H content may be manufactured by changing (increasing) the number of pulses.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of forming an ashable hard mask, comprising:
    providing a semiconductor device substrate in a deposition chamber;
    depositing on the substrate an ashable hard mask film by a plasma enhanced chemical vapor deposition (PECVD) process wherein the process temperature is below 500° C. and the resulting hard mask has a hydrogen content of less than 30%, the deposition process comprising a pulsed delivery flow of a hard mask precursor to the deposition chamber with a duty cycle of less than 100%; and,
    treating the deposited film with a plasma, during a time when the precursor flow is off.

2. The method of claim 1, wherein the plasma power is higher when the precursor flow is off.

3. The method of claim 1, wherein the precursor flow and plasma power "on" pulses do not overlap.

4. The method of claim 1, wherein the process temperature is between about 300 and 400° C.

5. The method of claim 1, wherein the process temperature is about 400° C.

6. The method of claim 1, wherein the resulting hard mask has a hydrogen content of less than 25%.

7. The method of claim 6, wherein the resulting hard mask has a hydrogen content of less than 20%.

8. The method of claim 7, wherein the resulting hard mask has a hydrogen content of about 15%.

9. The method of claim 1, wherein the pulsed precursor delivery flow has a frequency of between about 0.05 and 1 Hz.

10. The method of claim 9, wherein the pulsed precursor delivery flow has a frequency of between about 0.09 and 0.2 Hz.

11. The method of claim 10, wherein the pulsed precursor delivery flow has a frequency of between about 0.1 and 0.15 Hz.

12. The method of claim 11, wherein the pulsed precursor delivery flow has a frequency of about 0.1 Hz.

13. The method of claim 12, wherein the duty cycle of the pulsed precursor delivery flow is between 10 and 50%.

14. The method of claim 13, wherein the duty cycle of the pulsed precursor delivery flow is between 20 and 40%.

15. The method of claim 14, wherein the duty cycle of the pulsed precursor delivery flow is about 25%.

16. The method of claim 1, wherein the plasma pulse frequency is synchronized with the precursor pulse frequency such that the power is lower when the precursor flow is on and higher when the precursor flow is off.

17. The method of claim 16, wherein the deposition process further comprises a carrier gas flow.

18. The method of claim 17, wherein the carrier gas flow is pulse modulated in synchrony with the precursor pulse frequency such that the carrier gas flow is lower when the precursor flow is on and higher when the precursor flow is off.

19. The method of claim 18, wherein the deposition process further comprises a chamber pressure.

20. The method of claim 19, wherein the chamber pressure is pulse modulated in synchrony with the precursor pulse frequency such that the chamber pressure is higher when the precursor flow is on and lower when the precursor flow is off.

21. The method of claim 1, wherein the precursor is a hydrocarbon.

22. The method of claim 21, wherein the precursor is a hydrocarbon defined by the formula $C_XH_Y$, wherein X=2 to 10 and Y=2–24.

23. The method of claim 22, wherein the precursor is ethylene.

24. A method of forming an ashable hard mask, comprising:
   providing a semiconductor device substrate in a deposition chamber;
   depositing on the substrate an ashable hard mask by a plasma enhanced chemical vapor deposition (PECVD) process, the process comprising:
   a process temperature of less than 500° C.,
   a pulsed delivery flow of a hard mask precursor to the deposition chamber with a duty cycle of less than 100%, and a plasma treatment during a time when the precursor flow is off.

25. The method of claim 24, wherein the resulting hard mask has a hydrogen content of less than 30%.

26. The method of claim 24, wherein the process comprises a process temperature of no more than about 400° C., a pulsed delivery flow of a hard mask precursor to the deposition chamber having a frequency of between about 0.05 and 1 Hz with a duty cycle of less than 50%, and the resulting hard mask has a hydrogen content of less than 20%.

27. The method of claim 24, wherein the deposition process further comprises a pulsed plasma power, carrier gas flow and chamber pressure characteristics, and:
   the plasma pulse frequency is synchronized with the precursor pulse frequency such that the power is lower when the precursor flow is on and higher when the precursor flow is off;
   the carrier gas flow is pulse modulated in synchrony with the precursor pulse frequency such that the carrier gas flow is lower when the precursor flow is on and higher when the precursor flow is off; and
   the chamber pressure is pulse modulated in synchrony with the precursor pulse frequency such that the chamber pressure is higher when the precursor flow is on and lower when the precursor flow is off.

28. A method of modulating hydrogen content in a deposited ashable hard mask, comprising:
   determining a base ashable hard mask hydrogen concentration resulting from deposition using plasma enhanced chemical vapor deposition (PECVD) process parameters comprising a static hard mask precursor delivery flow to the deposition chamber;
   providing a semiconductor device substrate in a deposition chamber; and
   depositing on the substrate an ashable hard mask by the plasma enhanced chemical vapor deposition (PECVD) process altered such that the precursor delivery flow is pulsed, and the plasma power is on during a time when the precursor flow is off;
   whereby the hydrogen content in the resulting deposited ashable hard mask is less than the base ashable hard mask hydrogen concentration.

29. The method of claim 28, wherein the deposition process parameters further comprise a process temperature of less than 500° C. and the resulting hard mask has a hydrogen content of less than 30%.

30. The method of claim 28, wherein the precursor delivery flow is pulsed at a frequency of between about 0.05 and 1 Hz with a duty cycle of less than 50%.

31. The method of claim 30, wherein the deposition process parameters further comprise a process temperature of less than 400° C. and the resulting hard mask has a hydrogen content of less than 20%.

* * * * *